United States Patent [19]

De Wilde et al.

[11] Patent Number: 4,666,554
[45] Date of Patent: May 19, 1987

[54] METHOD OF MANUFACTURING A SENSOR HAVING A MAGNETIC FIELD SENSITIVE ELEMENT

[75] Inventors: Johannes De Wilde; Willibrordus G. M. van Den Hoek, both of Eindhoven, Netherlands

[73] Assignee: U.S. Philips Corporation, New York, N.Y.

[21] Appl. No.: 696,817

[22] Filed: Jan. 31, 1985

Related U.S. Application Data

[62] Division of Ser. No. 491,137, May 3, 1983, abandoned.

[30] Foreign Application Priority Data

May 6, 1982 [NL] Netherlands ............... 8201846

[51] Int. Cl.⁴ .................. H01L 43/08; H01L 43/12
[52] U.S. Cl. ............................. 156/643; 29/571; 29/580; 156/656; 204/192.32
[58] Field of Search ............. 156/643, 648, 656, 662, 156/657; 338/32 R; 204/192 E, 192 EC; 29/571, 580, 603; 148/DIG. 131, 1.5; 357/27, 55; 360/113, 122, 125

[56] References Cited

U.S. PATENT DOCUMENTS

| | | | |
|---|---|---|---|
| 4,151,574 | 4/1979 | Gerkema et al. | 360/113 |
| 4,256,514 | 3/1981 | Pogge | 156/643 X |
| 4,353,086 | 10/1982 | Jaccodine et al. | 29/580 X |
| 4,432,132 | 2/1984 | Kinsbron et al. | 204/192 E X |
| 4,444,617 | 4/1984 | Whitcomb | 156/657 X |
| 4,460,413 | 7/1984 | Hirata et al. | 156/667 X |

FOREIGN PATENT DOCUMENTS

58-15713 12/1983 Japan .

OTHER PUBLICATIONS

Okazaki et al., "Edge-Defined Patterning of Hyperfine Refractory Metal Silicide MOS Structures", IEEE Transactions on Electron Devices, vol. ED-28, No. 11, pp. 1364–1367, Nov. 1981.

*Primary Examiner*—Donald E. Czaja
*Assistant Examiner*—Ramon R. Hoch
*Attorney, Agent, or Firm*—F. Brice Faller

[57] ABSTRACT

A sensor suitable for measuring magnetic field gradients spanning very small regions has a magnetic field-sensitive element (37, 42) with a very accurately defined height and thickness (even into the nanometer range) which is perpendicular to the surface of a substrate (30, 41) so that the substrate surface may be used in aligning the element (37, 42) and is manufactured by, for example, depositing magnetic field-sensitive material (9) integrally on the surface of a substrate (5) and the walls and the bottom of a groove (8) provided therein and by removing the deposited material by means of an ion etching process with an ion beam incident at right angles to the substrate surface so that only the deposited material (10) on the walls remains.

9 Claims, 24 Drawing Figures

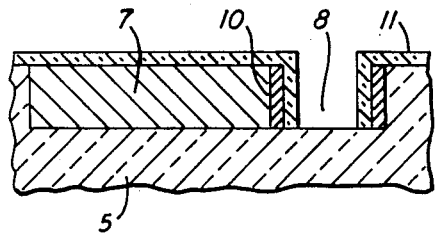
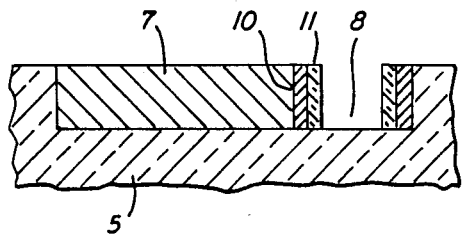
FIG. 4a    FIG. 4b
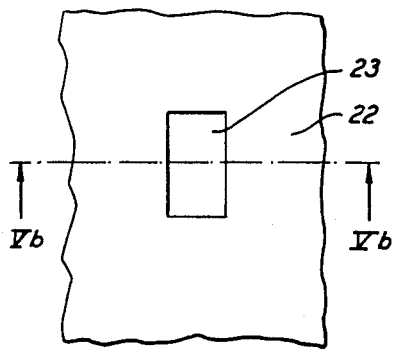
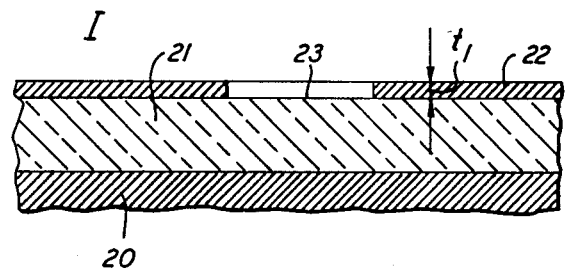
FIG. 5a    FIG. 5b
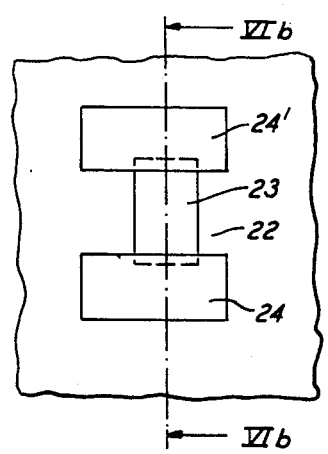
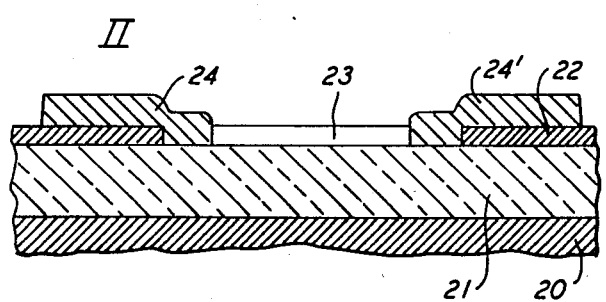
FIG. 6a    FIG. 6b

METHOD OF MANUFACTURING A SENSOR HAVING A MAGNETIC FIELD SENSITIVE ELEMENT

This is a division of application Ser. No. 491,137, filed May 3, 1983, now abandoned.

BACKGROUND OF THE INVENTION

The invention relates to a sensor having a substrate which supports a magnetic field-sensitive element in thin-film form, in which the magnetic field-sensitive element is deposited on a side wall of a groove extending in a surface of the substrate and in which the necessary leads are present to connect electric connections of the magnetic field-sensitive element to external circuits.

The invention also relates to a method of manufacturing a sensor having a magnetic field-sensitive element. A sensor having a magnetic field-sensitive element is known from U.S. Pat. No. 4,151,574 in the manufacture of which a groove having a defined shape is provided in a surface of a substrate, after which an auxiliary layer is deposited on the surface of the substrate on either side of the groove and on one wall of the groove at a first angle with the substrate, a layer of magnetic field-sensitive material is deposited on the auxiliary layer on either side of the groove and on the wall of the groove present opposite to said wall at a second angle with the substrate, the auxiliary layer with the magnetic field-sensitive material present thereon is then etched away and the layer of magnetic field-sensitive material remaining on one wall of the groove is connected to electrical leads.

In the method used of vapor-depositing at an angle in which moreover the two oppositely located walls of the groove extend obliquely to the substrate surface, a magnetic field-sensitive element of uniform thickness cannot be provided on one of the walls while using the shadow effect of the other wall. This means that a sensor manufactured by means of the known methods cannot have a magnetic field-sensitive element which extends at right angles to the substrate surface and has a uniform thickness. However, for many applications, a perpendicular position is required because only then it is possible to measure one given component of a magnetic field. With an oblique position of the element, this cannot be done because then the substrate surface can no longer serve as an alignment reference.

A further disadvantage of the method used of vapor deposition at an angle is that the height of the magnetic field-sensitive element cannot be adjusted accurately. A spreading of 0.5 μm has to be taken into account as a result of which elements having a height smaller than 5 microns cannot be manufactured with sufficient accuracy. Sensors having magnetic field-sensitive elements with a height smaller than 5 microns, and in particular smaller than 1 micron, are required, however, to measure magnetic fields which span very small regions in the micron range. For example, magnetic elements having a height smaller than one micron are required for measuring the stray fields of a magnetic bubble or measuring the write field of a magnetic head.

The above also means that the lower edge of the vapor-deposited element must be spaced by at least 0.5 microns from the bottom of the groove so as to prevent magnetic field-sensitive material being also deposited on the bottom of the groove. In fact, this material is not also removed upon lifting the auxiliary layer. In that case, the element would consist of two parts not situated in one plane and would, hence, also be sensitive to magnetic field components having different directions. Thus, it is not possible to use the depth of the groove (to be proportioned accurately) for adjusting the height of the element.

SUMMARY OF THE INVENTION

The present invention provides a sensor having a magnetic field-sensitive element deposited in a uniform thickness over the whole height of a side wall of a groove extending at least substantially perpendicularly to the substrate surface. With this concept, the way to "vertical" sensors with very accurately adjustable, very small height dimensions and high resistance values is opened.

The invention also relates to a method of manufacturing a sensor having a magnetic field-sensitive element provided on the wall of a groove extending in a substrate surface.

The method according to the invention is characterized by the following steps: providing, by means of a reactive ion etching process, a groove in the substrate having side walls extending at least substantially perpendicularly to the substrate surface and having a depth which corresponds to the desired height of the magnetic field-sensitive element to be provided; depositing a layer of the magnetic field-sensitive material on the whole substrate surface and on the walls and on the bottom of the groove; removing the layer provided on the substrate surface and on the bottom of the groove by means of an ion etching process with an ion beam incident transversely to the substrate surface, a layer of magnetic field-sensitive material remaining against the walls of the groove; providing and electrically connecting two connection conductors to two parts of a layer of magnetic field-sensitive material deposited on one of the groove walls.

The layer of magnetic field-sensitive material can be provided "integrally" on the whole substrate surface including the bottom of all the walls of the groove by vapor deposition or sputtering. Because all the walls of the groove are covered, a shadow technique need not be used in which the magnetic field-sensitive material is provided at an oblique angle with the substrate surface, but the magnetic field-sensitive material may advantageously be provided by means of sputtering from an electrode arranged opposite to the substrate.

The subsequent etching process by means of an ion beam makes it possible to remove all the material on the substrate surface and on the bottom of the groove, while the walls of the groove remain covered without this requiring the removal of an auxiliary layer by a lift-off technique, as is the known method. As a result of this, the frayed edge of the magnetic field-sensitive element resulting from the use of the known method is avoided.

The connection conductors may afterwards be provided on the substrate surface by sputtering, vapor deposition or electroplating, but they are preferably provided previously while sunk in the substrate surface.

For that purpose, an embodiment of the method in accordance with the invention is characterized in that two channels which in at least one place have a spacing which corresponds to the desired width of the magnetic field-sensitive element to be provided are etched in the substrate surface, that the channels are filled with an electrically conductive material and that by means of the reactive ion etching process, a groove is etched in the substrate surface having a wall which extends both across the two channels and said place.

By using the above-mentioned method which is based on the fact that grooves having perpendicular walls can be etched in a substrate by means of a reactive ion etching process, a magnetic field-sensitive element is obtained which is not only deposited on a wall of a groove extending perpendicularly to the substrate surface and having a uniform thickness, but which in addition makes electric contact with two conductors deposited in channels in the substrate surface. So herewith the desired sensor is produced.

For providing a protective (quartz) layer on the already deposited magnetic field-sensitive layer, the last two steps of the above-mentioned process may be repeated with the protecting material in question.

The above-described method leads to good results as long as the height of the magnitic field-sensitive element is sufficiently greater than the thickness. However, problems occur, when this becomes of equal order, i.e. comes in the nanometer range. However, the invention now also provides a novel method of avoiding said problems.

For that purpose, an alternative form of the method in accordance with the invention of manufacturing a sensor having a magnetic field-sensitive element is characterized in that a layer of magnetic field-sensitive material is deposited on a substrate surface, a layer of dielectric material is deposited on said layer, a groove having walls extending at least substantially perpendicularly to the substrate surface is provided in the layer of dielectric material by means of a reactive ion etching process, the groove not reaching down into the layer of magnetic field-sensitive material. The walls of the groove are covered with a layer of masking material, and the layer of dielectric material is etched away down to the layer of magnetic field-sensitive material. A projection having a crest of masking material remains above the magnetic field-sensitive material and the layer of magnetic field-sensitive material is structured by an etching process using the projection as a mask.

The linear structure of magnetic field-sensitive material which is realized in this manner has a height which corresponds to the thickness of the layer deposited at the beginning of the process and a thickness which corresponds to the thickness of the electrically conductive layer deposited on the groove wall. Since layer thicknesses as small as 30-40 nm can be readily realized, sensors having magnetic field-sensitive elements and a height and thickness dimensions of a few tens of nm can be realized by means of the method according to the invention.

With a correct choice of material and substrate, dimensions in the order of some ten monolayers (3 nm) are even possible.

An embodiment of the invention will now be described in greater detail with reference to the accompanying drawing.

BRIEF DESCRIPTION OF THE DRAWING

FIGS. 4a and 4b are elevations of a cross-sectional view taken on the line IV—IV of the substrate of FIG. 2c at two successive stages of providing a protective layer on the magnetic field-sensitive layer on the wall of the groove;

FIGS. 5-12 are sectional views through a substrate at the various stages leading to a magnetic field-sensitive element of ultrasmall dimensions;

DESCRIPTION OF THE PREFERRED EMBODIMENTS

Figure 1A:
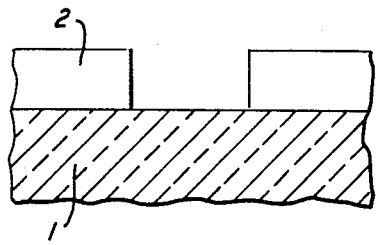
FIGS. 1a, 1b, 1c, 1d are cross-sectional views through a substrate at four successive stages of providing a channel in the substrate filled with a conductor material.
Figure 1B:
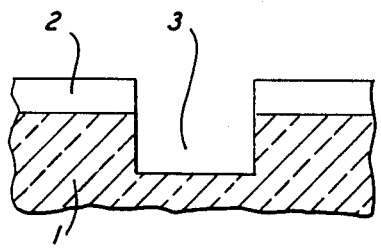
Figure 1C:
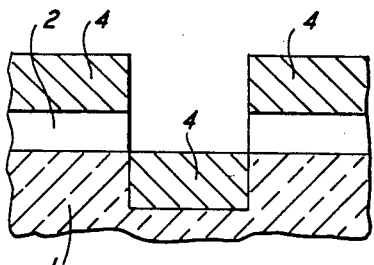
Figure 1D:
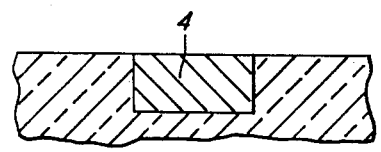

The sensor according to the invention can be realized as follows:

A (transparent) SiO$_2$ substrate (1) is provided, by means of photolithographic methods, with a lacquer pattern (2) which serves as a mask for etching a channel (3) by means of reactive ion etching (RIE), (see FIGS. 1a, 1b). Lacquer pattern (2) then serves as the substrate "to be lifted" upon filling the etched channel (3) by means of vapour deposition of aluminium (4) (see FIGS. 1c, 1d). An example of another suitable material for filling the channel 3 is Au.

Figure 2A:
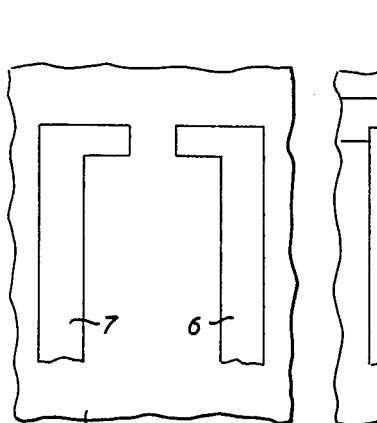
FIG. 2a is a plan view of a substrate having two channels provided therein in the manner shown in FIG. 1.
Figure 2B:
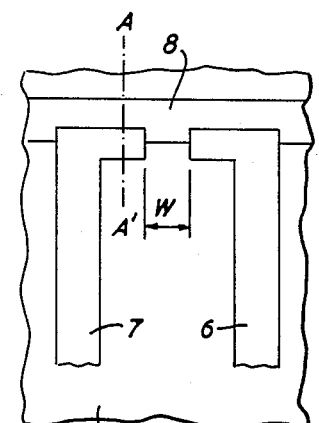
FIG. 2b is the same plan view as FIG. 2a after an elongate groove has been etched in the substrate.
Figure 3A:
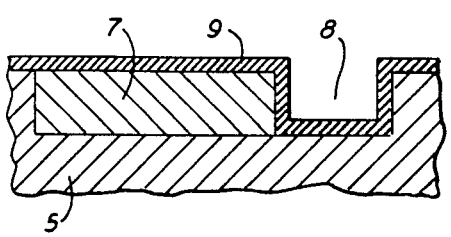
FIGS. 3a and 3b are elevations of a cross-sectional view taken on the line A—A' of the substrate of FIG. 2b at two successive stages in the process of covering the walls of the groove with a layer of magnetic field-sensitive material.
Figure 3B:
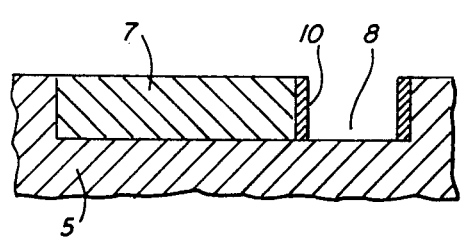

FIG. 2a shows a substrate (5) in which two such channels (6, 7) filled with a conductor material are provided. The structure thus obtained is provided with a lacquer pattern by means of photolithographic methods. This pattern is used as a mask for etching, by means of RIE, a groove (8) in which a magnetic field-sensitive element will be provided. The operative length W of the element is determined by the distance between the two channels (6, 7) (see FIG. 2b), the height is determined by the depth of the etched groove (8) (see FIG. 3b).

Figure 2C:
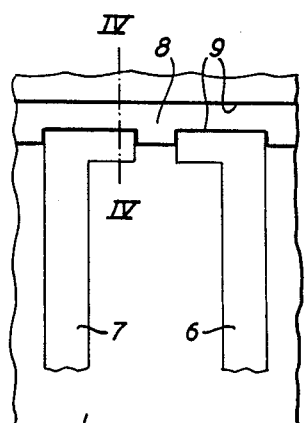
FIG. 2c is the same plan view as FIG. 2b after the walls of the groove have been covered with a layer of magnetic field-sensitive material.

After removing the lacquer, a thin layer of magnetic field-sensitive material 9 (NiFe or NiCo) is deposited on the surface of substrate 5. Said layer is then removed again by means of sputter etching or R.I.E., for example, by reversing the voltage between the electrode and the substrate in the sputtering device. FIG. 2c shows the situation in which the aluminium is left after etching the groove (8) so that one wall of the groove (8) as it were bypasses the channels (6, 7). The groove (8) extends over the full width of the substrate (5). The result of this procedure is that, after etching, a magnetic field-sensitive element (10) has remained against the walls of the groove (8) and electrically contacts the conductors (6, 7) provided in the substrate (5) (see FIG. 3b). Finally, the magnetic field-sensitive element (10) may be insulated by repeating the above procedure with an insulating material 11 (for example SiO$_2$) instead of the magnetic field-sensitive material 9 (see FIGS. 4a, 4b).

An alternative embodiment of the method in accordance with the invention will now be described with reference to FIGS. 5-12.

I. A 1 micron thick quartz layer (21) is provided on a (silicon) substrate (20) by means of Chemical Vapor Deposition (CVD). A layer (22) of a magnetic field-sensitive electrically conductive material having a thickness "$t_1$" is provided on said layer. Sputter deposition or vapor deposition are eminently suitable methods for providing the thin layer (22). A mask is provided on the layer (22) by means of photolithographic methods and a first channel (23) is etched in the conductor layer 22 as is shown in FIGS. 5a and 5b. The etching method used may be a wetchemical method but sputter etching or Reactive Ion Etching (RIE) may also be used.

II. A Molybdenum-Gold-Molybdenum sandwich (approximately 3000 Å thick) is sputtered on the layer (22), after which contact areas (24, 24') are formed by means of photolithographic methods and, for example, wet-chemical etching. The distance between the contact areas (24, 24') and hence the operating length of the magnetic field-sensitive element may be varied by the mask.

Figure 7A:
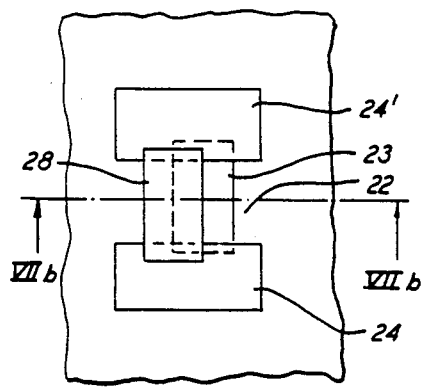
Figure 7B:
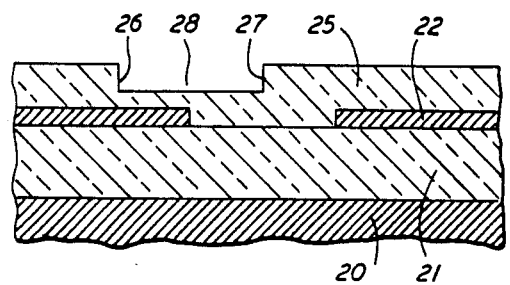

III. Referring to FIG. 7, a dielectric layer (25) of, for example, quartz having a thickness of a few tenths of a micron up to at most one micron is then deposited. A photolithographic step is then carried out again in which the same lacquer pattern is provided as was necessary to etch the first channel (23) in the layer (22). This pattern is aligned while slightly shifted with respect to the pattern in the layer (22). This lacquer pattern is transferred anisotropically in the underlaying $SiO_2$ layer (25) by means of reactive ion etching (RIE) in a $CHF_3/Ar$ gas mixture. The walls (26, 27) of the second channel (28) formed are perpendicular. The depth of the second channel (28) is at most equal to the thickness of the layer 25. To ensure that the layer 22 remains attached during etching the layer 25, the groove 28 must not reach the layer 22.

Figure 8:
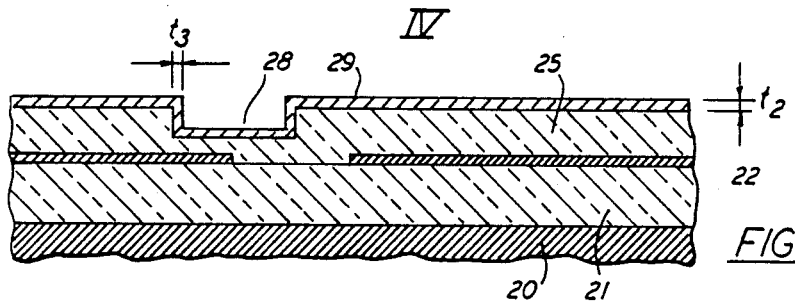
Figure 9:
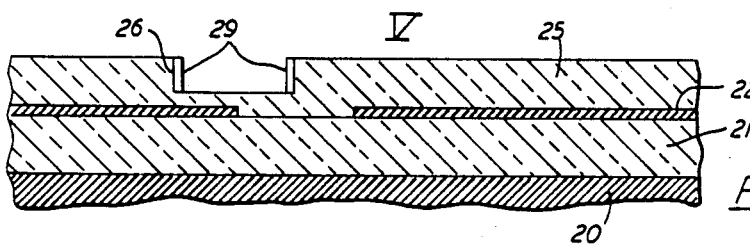

IV. The assembly is covered with a masking layer (25) of, for example, molybdenum (29) by means of sputtering. The steep side walls of the channel (28) will also be covered by molybdenum (FIG. 8). The thickness of the side wall coating depends on the sputter conditions chosen and is, for example, half the layer thickness $t_2$ which is measured on the surface. The thickness $t_3$ of the side wall coating determines the ultimate width of the magnetic field-sensitive element.

V. The layer of Molybdenum 29 on the surface is etched (anisotropically) by means of RIE in a $CF_4/O_2$ plasma resulting in the situation shown in FIG. 9.

Figure 10:
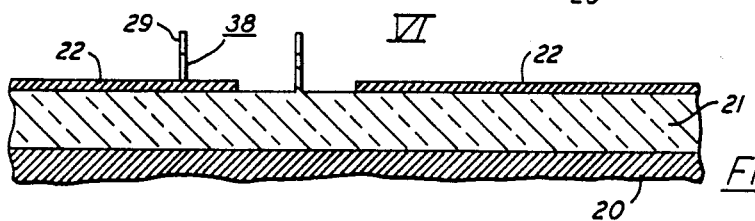

VI. The Molybdenum 29 on the side wall (26) is then used as a mask to anisotropically etch the dielectric $SiO_2$ layer (25). (RIE in a $CHF_3/Ar$ plasma). (FIG. 10). The underlying magnetic field-sensitive layer (22) serves as an etchant stop.

Figure 11:
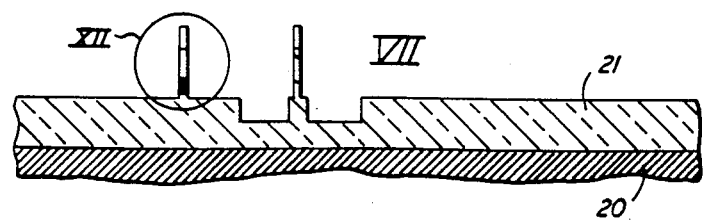
Figure 12:
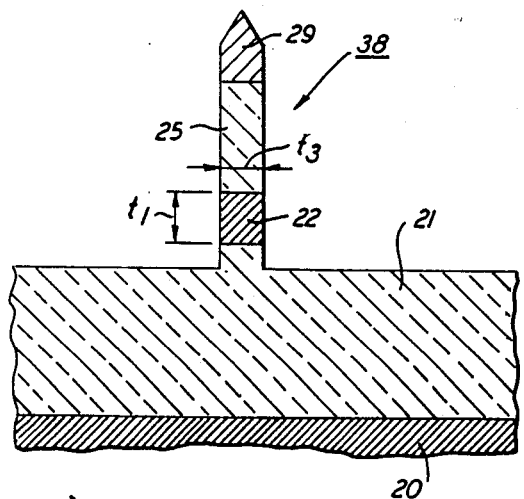

VII. The resulting projection (38) is used as a mask to structure the magnetic field-sensitive layer (22) (FIG. 11 and FIG. 12). Various methods may be used. Important in choosing the method is that minimum redeposition takes place. The particularly convenient methods of forming the layer 22 are:

Reactive Ion Etching: in this case no redeposition occurs because the gaseous reaction products are exhausted. A condition is, of course, that the layer to be structured only forms gaseous reaction products.

Ion-Milling: this is ion-beam sputter etching in which the angle of incidence may deviate from the usual 90° in normal sputter etching. By choosing the correct angle, it is possible to prevent side wall coating of the dam. This method can be more universally used.

Finally, the Molybdenum mask 29 may be removed. Wet-chemical etching away is a possibility but it is better to use a "dry" etching method, for example, RIE or plasma etching in $CF_4/O_2$.

Figure 13A:
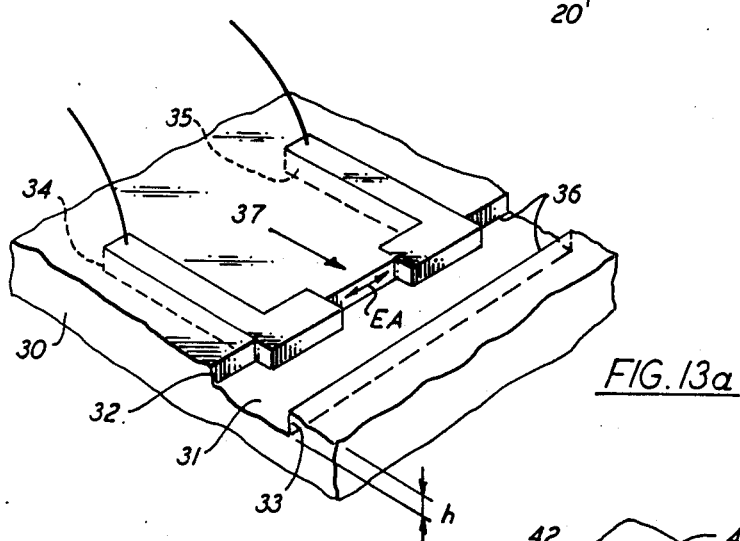
FIG. 13 is a diagrammatic perspective view of a sensor according to the invention.

FIG. 13a is a perspective view of a substrate 30 of $SiO_2$ in which a groove 31 is etched having a defined depth h between 0.2 and 2 $\mu$m and perpendicular side walls 32, 33. The substrate 30 furthermore comprises two channels 34, 35 which are filled with aluminium. The wall 32, as well as the wall 33, is coated with a 600 Å thick layer of magnetic field-sensitive material 36. The layer of magnetic field-sensitive material 36 on the wall 32 electrically contacts the aluminium-filled channels 34, 35, so that a magnetic field-sensitive element having an active part 37 between the channels 34, 35 serving as connection conductors is formed. In spite of a comparatively small length of the active part 37, the magnetic field-sensitive element formed by the layer 36 on the wall 32 may in its totality have a sufficient length to be sure that the easy axis of magnetization (EA) is parallel to the longitudinal axis of the element.

Figure 13B:
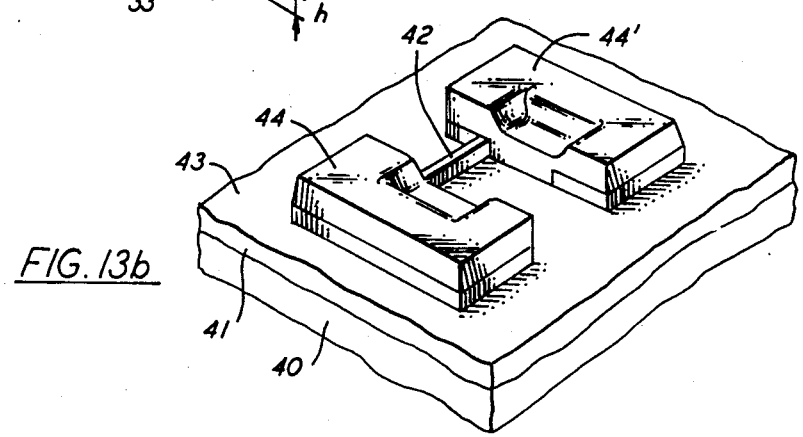

FIG. 13b is a perspective view of a substrate 40 of silicon which is covered with a layer 41 of $SiO_2$. By means of the steps described above (sub I-VII), a magnetic field-sensitive element 42 is provided on the substrate which extends at right angles to the surface 43 and has very small height and width dimensions. Connection conductors 44, 44' are also indicated for the connection of the element 42 to external circuits. The very fine structure of the element 42 has been obtained without requiring complicated exposure steps.

A magnetic field-sensitive element has always been referred to hereinbefore. This is to be understood to mean both a magneto-resistive element and a Hall element.

A sensor having a magnetic field-sensitive element may have the structure shown in FIG. 13a or b or may form part of a magnetic yoke the limbs of which "draw in" the magnetic flux and channel it to the magnetic field-sensitive element.

Reverting to FIGS. 7-11 it is to be noted that the dielectric layer 25 may alternatively consist of a polymer (for example a cured photolacquer) in combination with a masking layer 29 of $SiO_2$. The advantage hereof is that a polymer can be anisotropically etched in a simple manner and at a high rate by means of a low pressure (in the order of magnitude of 10 mbar) $O_2$ reactive ion etching plasma. Very great etching differences between the polymer and the $SiO_2$ can be achieved (for example, a factor 100).

What is claimed is:

1. A method of manufacturing a sensor having a magnetic field sensitive element on the sidewall of a groove in a substrate surface comprises the following steps:

etching two spaced apart channels in the substrate surface, said channels having in one place a spacing which corresponds to the desired length of said element;

filling said channels with conductive material;

providing a groove in said substrate by means of a reactive ion etching process, said groove having opposed sidewalls and a bottom, a sidewall extending between said channels at said place and extending substantially perpendicularly into said substrate surface at said one place, said groove having a depth corresponding to the desired height of the magnetic field sensitive element;

depositing a layer of magnetic field sensitive material on the substrate surface and in said groove;

removing the layer from the surface of the substrate and the bottom of the groove by reactive ion etching with an ion beam perpendicular to the substrate surface, thereby leaving a layer of magnetic field sensitive material on said sidewall at said place.

2. The method of claim 1, wherein said layer of magnetic field sensitive material is deposited by sputtering.

3. The method of claim 1, wherein the recited steps are undertaken serially.

4. A method of manufacturing a sensor having a magnetic field sensitive element on the surface of a dielectric substrate comprises the following steps:

depositing a layer of magnetic field sensitive material on said dielectric substrate;

etching a first channel in said layer of magnetic field sensitive material;

forming a pair of spaced apart conductors on said layer of magnetic field sensitive material, which conductors extend into said first channel, said conductors having at one place adjacent said first channel a spacing which corresponds to the desired length of said element;

depositing a layer of dielectric material on said layer of magnetic field sensitive material;

providing a second channel in said dielectric layer and extending between said conductors, said second channel having opposed sidewalls and a bottom, one sidewall extending substantially perpendicularly into said dielectric layer at said one place, the other sidewall lying over said first channel, said bottom being spaced above said layer of magnetic field sensitive material, said second channel having a depth corresponding to the desired height of the magnetic field sensitive element;

depositing a layer of masking material on said dielectric layer and in said second channel;

anisotropically etching the masking material from the surface of the dielectric layer and the bottom of the second channel such that the masking material remains on said one sidewall;

anisotropically etching the dielectric layer down to the underlying magnetic field sensitive layer, the masking material on said one sidewall masking the dielectric thereunder leaving a projection above the magnetic field sensitive layer;

anisotropically etching the magnetic field sensitive layer, the projection serving as a mask for the magnetic field sensitive material thereunder, thereby leaving the desired element on the surface of the substrate extending between said conductors.

5. The method of claim 4 wherein said substrate comprises a layer of quartz on the surface thereof.

6. The method of claim 4 wherein said dielectric layer is quartz.

7. The method of claim 4 wherein said dielectric layer is less than one micron thick.

8. The method of claim 4 wherein a molybdenum-gold-molybdenum sandwich about 3000 Å thick is sputtered onto the layer of magnetic field sensitive material prior to forming the spaced apart conductors.

9. The method of claim 4 wherein the thickness of said masking material on said one sidewall is used to determine the ultimate width of the magnetic field sensitive element.

* * * * *